United States Patent [19]

Schuck

[11] 4,396,935
[45] Aug. 2, 1983

[54] VLSI PACKAGING SYSTEM

[75] Inventor: David B. Schuck, Escondido, Calif.

[73] Assignee: NCR Corporation, Dayton, Ohio

[21] Appl. No.: 194,521

[22] Filed: Oct. 6, 1980

[51] Int. Cl.[3] .................. H01L 23/02; H01L 23/42
[52] U.S. Cl. ............................ 357/74; 174/52 R; 357/80; 357/81
[58] Field of Search .............. 357/74, 79, 80, 85, 357/81; 174/52 S, 52 R

[56] References Cited

U.S. PATENT DOCUMENTS

| 3,491,271 | 1/1970 | Weaver et al. | 357/79 |
| 3,700,788 | 10/1972 | Spurek | 357/74 |
| 4,345,267 | 8/1982 | Corman et al. | 357/81 |

Primary Examiner—James W. Davie
Attorney, Agent, or Firm—J. T. Cavender; Edward Dugas; Donald P. Gillette

[57] ABSTRACT

The present invention relates to an integrated circuit package for flat circuit elements such as an integrated circuit chip and an electrical connector for receiving such integrated circuit package. The integrated circuit package comprises a round ceramic carrier or substrate upon which an integrated circuit chip is mounted. The electrical connector of the present invention is a cylindrically shaped hollow socket, the inside diameter of the socket being large enough such that the ceramic substrate may be placed in the hollow. The inside cylindrical wall contains resilient pin-like connections arranged in a circle therein for making contact with a corresponding conductor of the integrated circuit package. The outside surface of the cylindrically shaped electrical connector is threaded for receiving a cap which holds the integrated circuit package against the resilient pin-like connections.

3 Claims, 9 Drawing Figures

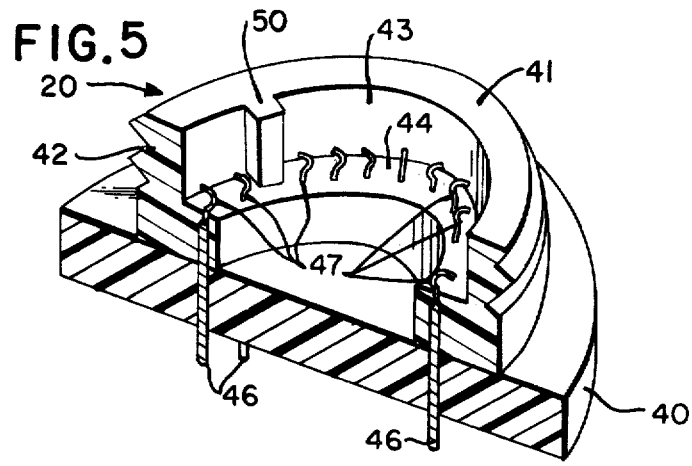
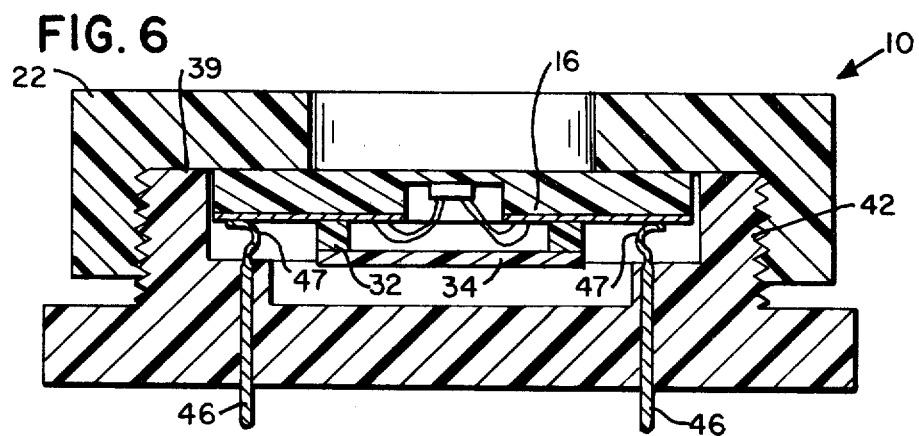
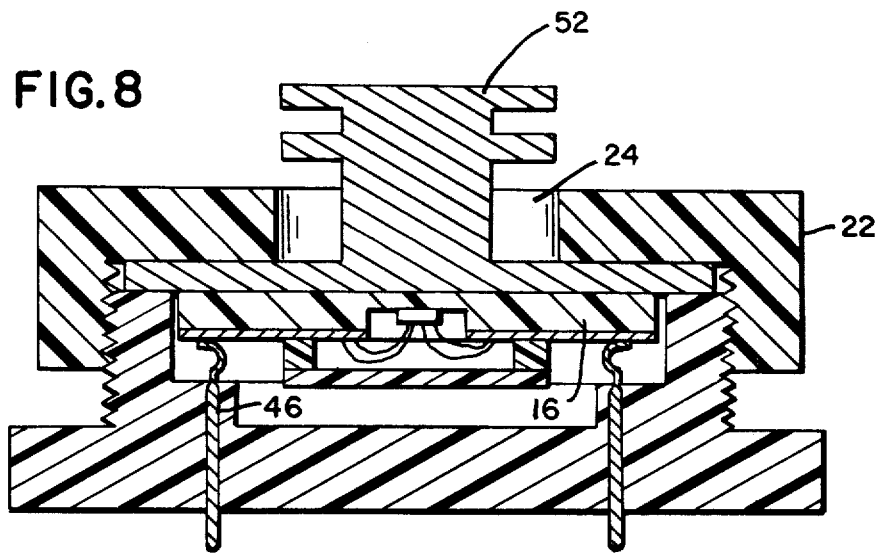

VLSI PACKAGING SYSTEM

BACKGROUND OF THE INVENTION

The present invention relates to a circuit package and, more particularly, to a leadless circuit package for supporting flat circuit elements such as integrated circuit chips and an electrical connector for receiving such package.

Leadless integrated circuit packages are commonly used for mounting integrated circuits on printed circuit boards, computer backpanels, and the like, and have signicant advantages over conventional dual in-line packages (DIP) and single in-line packages (SIP) in the manufacture of large electronic systems, such as computers. If, during the assembly of integrated circuits on a computer backpanel, a defect is discovered in one of the integrated circuits, the leadless package having the defective integrated circuit is simply removed from its electrical connector and replaced with a new package. This eliminates both the problem of removing packages having soldered leads or pins and the potential for bending or breaking such pins when removed.

An integrated circuit package includes a support disc with an integrated circuit chip mounted on it. In present systems the integrated circuit packages generally are of a square or rectangular configuration. The integrated circuit package is inserted into a plastic socket that has a metal spring-loaded lid. In this manner, the integrated circuit package is suspended between a plurality of spring-loaded socket contact pins and the metal spring-loaded lid. The purpose of the lid is simply to hold the integrated circuit package down against the socket contact pins. In such systems the lid is often difficult to close and in some cases the lid can appear to be closed when it in fact is not. Further, since the lid is metal, care must be taken in the design and maintenance of the system to avoid contact between the lid and adjacent circuitry.

SUMMARY OF THE INVENTION

In accordance with the present invention an integrated circuit package for supporting flat circuit elements, including integrated circuit chips, includes a non-conductive, round support disc that has a top surface and a bottom surface. A plurality of electrical conductors is affixed to the top surface of the disc to provide a plurality of operative connections between the flat circuit elements and the periphery of the disc. An electrical connector is provided for receiving the integrated circuit package or an integrated circuit having a round configuration and further having a plurality of electrical conductors. The electrical connector comprises a housing with a cylindrical cavity for receiving the integrated circuit package or integrated circuit, the housing being of an electrically non-conducting material, and having a plurality of pins. The plurality of pins extend from outside the housing, through the housing, and into the cylindrical cavity, thereby providing a plurality of electrical contact points for the corresponding plurality of electrical conductors of the integrated circuit package or the integrated circuit. The pins protrude into the cylindrical cavity in a circular pattern around the inside of the housing and in a plane perpendicular to the axis of the housing. The plurality of pins are of a resilient electrically conductive material.

It is, therefore, an object of the present invention to provide a leadless integrated circuit package.

It is another object of the present invention to provide a leadless integrated circuit package and to provide an electrical connector for receiving the leadless integrated circuit package.

These and other objects of the present invention will become more apparent when taken in conjunction with the following description, and attached drawings, wherein like characters indicate like parts and which drawings form a part of the present application.

BRIEF DESCRIPTION OF THE DRAWINGS

FIG. 5 is a perspective sectional view of the connector of FIG. 1 taken along the section line II—II;

FIG. 6 is a cross-sectional view of the electrical connector assembly of FIG. 1 taken along section line II—II with the integrated circuit package mounted in the electrical connector and a cap in place securely holding the integrated circuit package;

FIG. 8 is a cross-sectional view of the electrical connector assembly of FIG. 1 taken along the section line II—II with a heat sink mounted in the electrical connector.

DETAILED DESCRIPTION

Figure 1:
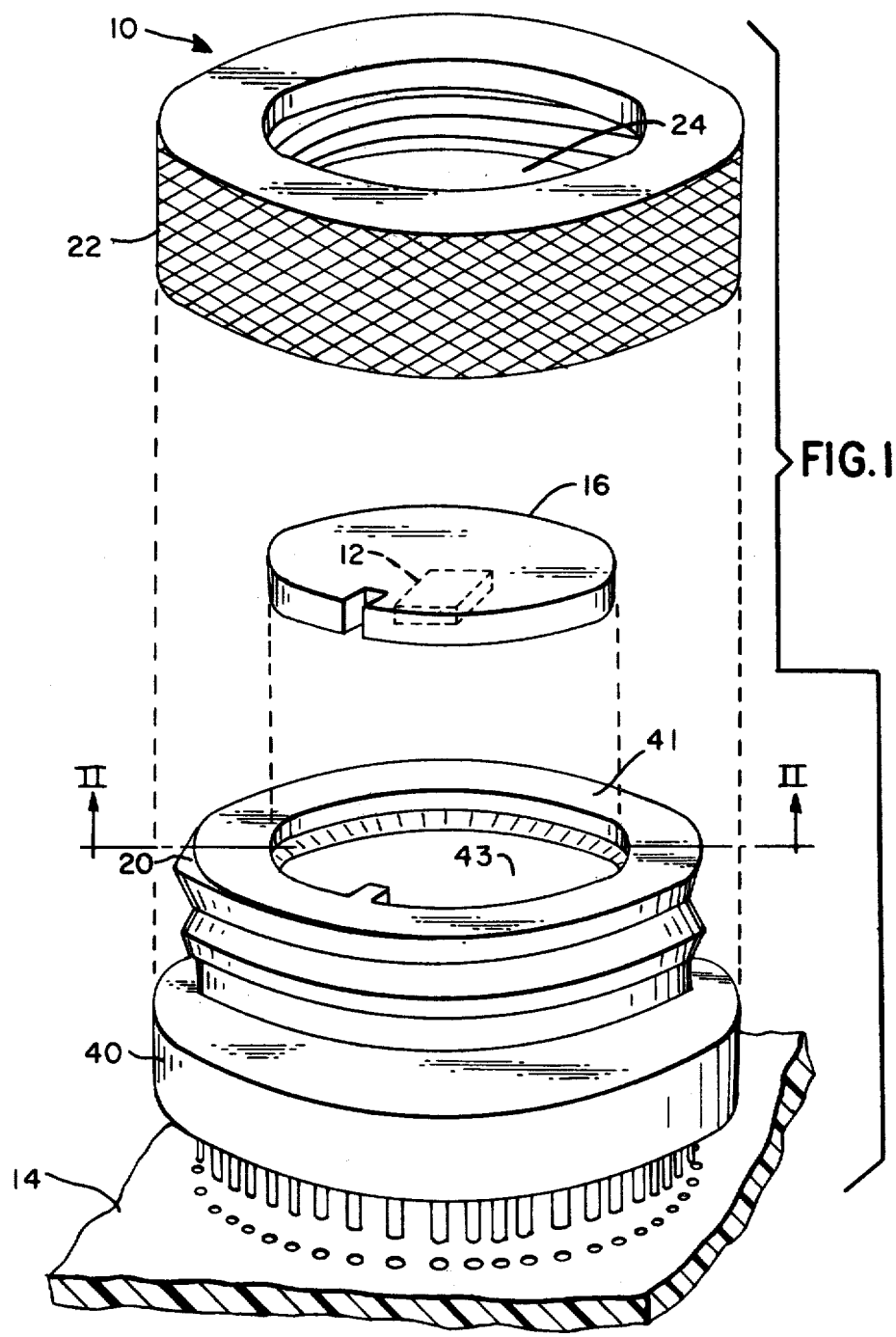
FIG. 1 is an exploded perspective view of an electrical connector assembly in accordance with the present invention, with an integrated circuit package shown positioned for insertion into the electrical connector.

FIG. 1 shows an electrical connector assembly 10 for electrically connecting an integrated circuit chip 12 to a backpanel 14. The integrated circuit chip 12 is supported or mounted on the underside of a disc 16 that forms the support member of a leadless integrated circuit package. The integrated circuit chip 12 is mounted in a generally central location on the disc 16 and is electrically connected by appropriate conductive paths provided on a surface of the disc 16 to a plurality of pins of an electrical connector 20. The integrated circuit package 16 is inserted into the electrical connector 20 and is held in place by a cap 22 screwed onto the electrical connector. A hole 24 small enough to prevent the integrated circuit package from passing through it but large enough to allow for a variety of heat sink alternatives is formed in the cap.

The integrated circuit package will be described in conjunction with FIGS. 1, 2, 3 and 4. The disc 16 is of a ceramic material, although other non-conductive materials may be used, forming what is more commonly known in the art as a carrier or substrate and it has a circular recess 26 with a diameter large enough to accept the integrated circuit chip 12. The integrated circuit chip 12 is placed in the recess 26 and affixed to the inside bottom surface 27 of the recess. A plurality of electrical conductors 28 are affixed to the upper surface 29 of the disc 16 so that they extend radially from the periphery of the recess 26 to the periphery of disc 16. The integrated circuit chip 12 is connected via leads 30 to the respective electrical conductors 28 in a manner well known in the art.

Figure 2:
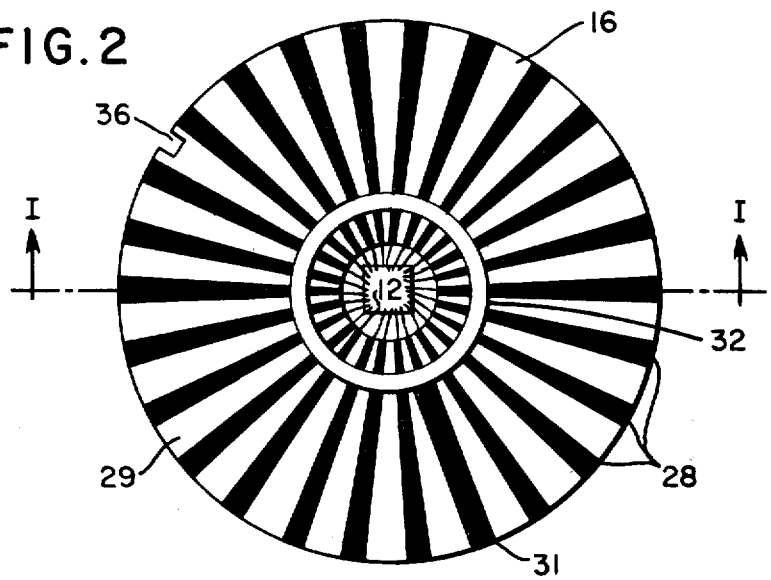
FIG. 2 is a top view of the integrated circuit package of the present invention with a lid removed.
Figure 3:
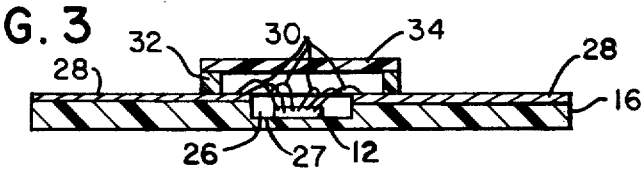
FIG. 3 is a cross-section of the integrated circuit package of FIG. 2 taken along the section line I—I, with the lid in place.
Figure 4:
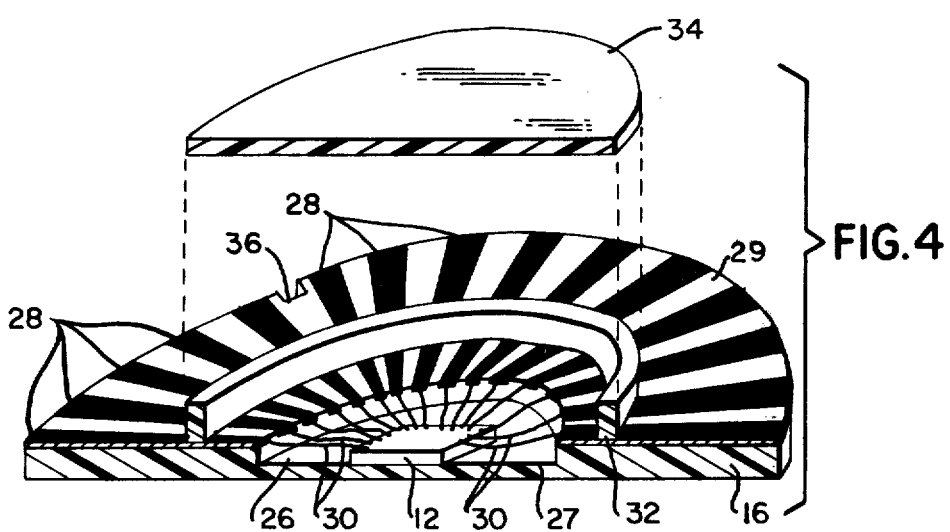
FIG. 4 is a partial-exploded perspective sectional view of the integrated circuit package of FIG. 2 taken along the section line I—I.

Although FIG. 2 shows the electrical conductors 28 extending radially outwardly and with the width of the electrical conductors 28 increasing as they approach the periphery of disc 16, it will be understood that various configurations may be utilized for the electrical conductors 28. For example, the width of each conductor may remain constant, as shown by electrical conductors 31, thereby reducing the amount of electrically conductive material required for the electrical conductor 28. This is especially important when electrical conductors 28 utilize a high cost metal such as gold. The electrical conductors 28 need to have an adequate cross-section, to carry the current required by the chip 12 and the width of each of the conductors must be great enough to insure proper contact with its respective pin in the electrical connector 20.

In order to protect the integrated circuit chip 12, a housing covers the integrated circuit chip 12. A ring 32 is affixed to the upper surface 29 of integrated circuit package 16 and is made of a non-conductive material and covered with a lid 34 of a similar non-conductive material. Note that FIG. 2 shows the housing without the lid 34 attached.

A notch 36 is formed in the periphery of the disc 16 to hold the disc in a fixed position so that it is not free to rotate in the electrical connector 20, and the integrated circuit package 16 is properly positioned in the electrical connector 20.

The electrical connector 20 will now be described in conjunction with FIGS. 1 and 5. The electrical connector 20 comprises a base 40 made of a non-conductive material having a disc-like shape. In the preferred embodiment, a cylindrical wall 42 having a top surface 41, whose outside diameter is less than that of the base 40, is affixed to the base 40. The axis of the cylindrical wall 42 is coincident with the axis of the base 40, and the cylindrical wall 42 and base 40 formed a cavity 43, which serves as a receptacle for receiving integrated circuit package.

The inside diameter of cylindrical wall 42 at the opened end, i.e., that end of the cylinder remote from the base 40, is just large enough to receive the integrated circuit package 16. The inside diameter of cylindrical wall 42 at the closed end, i.e., the end closer to the base 40, is smaller than the inside diameter at the opened end. The smaller diameter inside wall rises toward the open end within the cavity 43, the smaller diameter inside wall maintaining the same diameter. At a point before reaching the top surface 41, the diameter changes to equal that of the inside diameter of the opened end, forming a step or pedestal 44 within the cavity 43. The diameter of the smaller inside diameter wall is large enough to accept the ring 32 and lid 34 of the integrated circuit package 16. A plurality of pins 46 are arranged in a circular fashion extending from outside the base 40 and are sufficiently long to extend through backpanel 14 and through the cylindrical wall 42, into the cavity 43 of electrical connector 20. The pins enter the cavity 43 from the step or pedestal 44 surface, forming a plurality of electrical contact points 47 for the electrical conductors 28 of the integrated circuit package 16. Pins 46 along the surface of the pedestal 44 are of a resilient electrically conducting material.

A keyway 50 runs along the inside surface of cylindrical wall 42 parallel to the cylindrical wall axis. The outside of the cylindrical wall is threaded to provide a fastening means for the cap 22.

FIG. 6 shows a cross-section of the electrical connector assembly 10 fully assembled, the support disc 16 being held firmly in place between the cap 22 and the resilient spring-like electrical contact points 47 of pins 46. It will be recognized that many alternative means exist for holding the integrated circuit package 16 in the electrical connector 20. In the preferred embodiment, the holding device is a cap 22, the inside circular surface 39 of which forms a positive stop against the top surface 41 of cylindrical wall 42. The distance between top surface 41 and the pedestal 44 is such that when cap 22 is firmly against the positive stop, the disc 16 applies the proper compression force against the electrical contact points 47 of pins 46. The ring 32 and lid 34 of integrated circuit package 16 extend into the cavity 43, the smaller inside diameter of cylindrical wall 42 being large enough to accept the ring 32 and the height of the pedestal 44 being high enough to accept ring 32 and lid 34, allowing the electrical conductors 28 to press firmly against the electrical contact points 47 of pins 46. The integrated circuit package 16 is placed upside down into the cavity 43 of the electrical connector 20, so that the notch 36 coincides with keyway 50.

It will be recognized by those skilled in the art that additional keyways and notches may be placed in the electrical connector 20 and in the disc 16, respectively, so as to code corresponding integrated circuit packages, thereby eliminating the risk or possibility of placing an incorrect integrated circuit package into the wrong electrical connector 20. It will be further recognized that many alternatives exist for guiding the integrated circuit package into the electrical connector 20, such as having the notch(s) in the inner cylindrical wall and a corresponding tab(s) on the disc 16.

Figure 7:
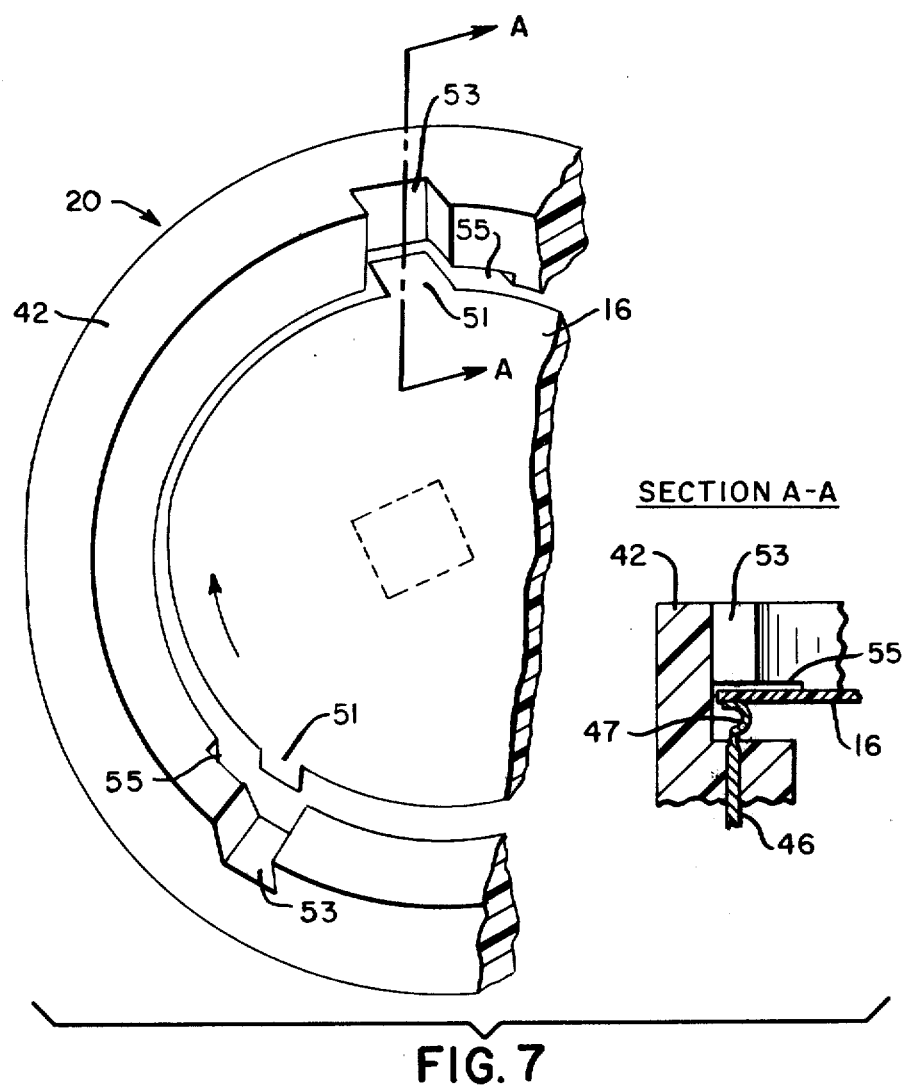
FIG. 7 is a wide angle perspective top view of an alternate embodiment of the electrical connector.

In an alternative embodiment, shown in FIG. 7, the disc 16 contains tabs 51 allowing the disc 16 to be guided and held firmly in place against the contact points 47 of pins 46. In this embodiment the inner surface of the cylindrical wall 42 contains slots 53 corresponding to the tabs 51. After the integrated circuit package is inserted into electrical connector 20 and pressed against the resilient electrical contact points 47 of pins 46, the integrated circuit package is rotated clockwise so that the tab 51 is placed under a corresponding lip 55, thereby holding the integrated circuit package in place. The distance between the lip 55 and the pins is selected to cause the proper compression force to be placed against the electrical contact points 47 of pins 46.

Conceivably, the flat circuit element such as the integrated circuit chip could have a circular configuration and be large enough and strong enough so that it would not need to be mounted on the support disc 16. In such case the integrated circuit could be directly inserted into electrical connector 20 if the proper guide were included in the integrated circuit and if the conductors of the integrated circuit corresponded to the electrical contact points 47 of pins 46 of the electrical connector 20.

Figure 9:
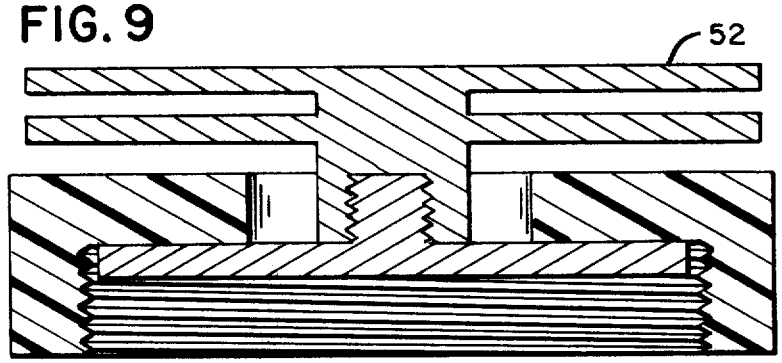
FIG. 9 is a cross-sectional view of the electrical connector assembly of FIG. 1 taken along section line II—II showing an alternative embodiment of a heat sink shown inserted in the cap of the electrical connector.

FIGS. 8 and 9 show two varieties of heat sink alternatives. In FIG. 8 the hole 24 in cap 22 is small enough to hold the disc 16 properly against the electrical contact points 47 of pins 46 and is large enough to permit fins of a heat sink 52 to pass through the. If additional cooling is required, larger fins may be utilized by constructing the heat sink 52 in two parts as shown in FIG. 9. It will be recognized by those skilled in the art that many alternative forms of heat sinks 52 may be utilized in conjunction with the electrical connector 20 of the present invention.

While there has been shown what is considered to be the preferred embodiment of the invention, it will be manifest that many changes and modifications can be made therein without departing from the essential spirit and scope of the invention. It is intended, therefore, in the annexed claims to cover all such changes and modifications which fall within the true scope of the invention.

I claim:

1. A package to contain an integrated circuit that includes a semiconductor chip having a plurality of leads connected to the chip, said package comprising:

an insulating support disc having a back surface and a front surface and a recess in a region of said front surface of the disc, the recess having a perimetral wall and a bottom wall defining a space large enough to receive the chip, the chip being affixed to the bottom wall of the recess with the leads extending outwardly;

a plurality of conductors adhering to the top surface of the disc and extending outwardly toward the outer perimeter of the disc from the region in which the recess is defined, each of the leads from the chip being conductively affixed to radially inward regions of respective ones of the conductors;

an annular, insulating ring having one axial end surface affixed to the front surface of said disc outwardly of said radially inward regions of the conductors;

an insulating cover disc attached to the other axial end surface of the annular ring and forming, with the ring and the support disc, an enclosure for the chip;

a plurality of contact members, each comprising a relatively rigid pin portion and a resilient end;

rigid base means to support the pin portions of the contact members in insulated, spaced-apart arrangement with the resilient ends of the contact members aligned with radially outward portions of respective ones of the conductors, the base means comprising a tubular portion having a larger inner diameter than the outer diameter of the support disc and an inner axial length greater than the thickness of the support disc, the outer surface of the tubular portion being threaded;

a cap having an end portion with a central aperture and a tubular portion with an internal thread that conforms to the externally threaded outer surface of the tubular portion of the base means, whereby the cap may be screwed onto the tubular portion of the base means to enclose the chip, the support disc and the conductors thereon, and the insulating ring and cover disc attached thereto;

heat transfer means comprising an end disc portion affixed to the rear surface of the support disc to receive and transfer heat therefrom, the outer perimeter of the disc portion extending at least part way across the annular end wall of the tubular portion of the base means to close off the tubular portion, the heat transfer means further comprising: a central stem extending through the aperture in the cap, and heat dissipation plate means extending outwardly from the stem outside of the cap; and alignment means to hold the support disc and the base means in fixed angular relationship to allow the resilient ends of the contact members to engage the conductors on the support disc only in a predetermined alignment.

2. The package of claim 1 in which the heat transfer means extend radially outwardly a greater distance than the radial dimension of the aperture in the cap, and the stem comprises:

an outer part to which the heat dissipation plate means are attached, and an inner part; and locking means to connect the inner part to the disc portion of the heat transfer means.

3. The package of claim 1 or claim 2 in which the heat dissipation plate means comprises a circular plate extending radially outwardly perpendicular to the axis of the stem.

* * * * *